US007136762B2

(12) United States Patent
Ono

(10) Patent No.: US 7,136,762 B2
(45) Date of Patent: Nov. 14, 2006

(54) SYSTEM FOR CALCULATING REMAINING CAPACITY OF ENERGY STORAGE DEVICE

(75) Inventor: Mikio Ono, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 58 days.

(21) Appl. No.: 11/030,336

(22) Filed: Jan. 5, 2005

(65) Prior Publication Data

US 2005/0154544 A1  Jul. 14, 2005

(30) Foreign Application Priority Data

Jan. 14, 2004 (JP) ............................. 2004-007376

(51) Int. Cl.
    *G06F 19/00* (2006.01)
(52) U.S. Cl. .................. 702/63; 702/79; 702/182; 324/427; 324/428; 320/132; 320/136; 361/18; 361/56; 361/79
(58) Field of Classification Search ................ 702/60, 702/63–65, 79–80, 182, 189; 324/427, 428, 324/431; 320/132, 136; 361/18, 56, 79
    See application file for complete search history.

(56) References Cited

U.S. PATENT DOCUMENTS

| 5,656,915 | A | * | 8/1997 | Eaves ........................ 320/118 |
| 5,684,404 | A | * | 11/1997 | Millar ....................... 324/426 |
| 6,018,700 | A | * | 1/2000 | Edel .......................... 702/60 |
| 6,054,861 | A | * | 4/2000 | Takahashi ................... 324/428 |
| 6,359,419 | B1 | | 3/2002 | Verbrugge et al. |
| 6,411,098 | B1 | * | 6/2002 | Laletin ....................... 324/436 |
| 2002/0101243 | A1 | | 8/2002 | Mentgen et al. |

FOREIGN PATENT DOCUMENTS

| JP | 6-242193 A | 9/1994 |
| JP | 8-179018 A | 7/1996 |
| JP | 11-103505 A | 4/1999 |
| JP | 11-223665 A | 8/1999 |
| JP | 2003-035755 | 2/2003 |

OTHER PUBLICATIONS

Pascoe et al., 'VRLA Battery Capacity Estimation Using Soft Computing Analysis of the Coup de Fouet Region', 2000, IEEE Publicaiton, pp. 589596.*

* cited by examiner

*Primary Examiner*—Marc S. Hoff
*Assistant Examiner*—Elias Desta
(74) *Attorney, Agent, or Firm*—Darby & Darby

(57) ABSTRACT

The remaining capacity of a battery obtained by integrating current and that obtained from the estimated open circuit voltage of the battery are weighted with a weight which varies depending on the operating conditions of the battery as needed and the weighted remaining capacities are combined into the final remaining capacity. Thus, the disadvantages of the remaining capacity based on current integration and those of the remaining capacity based on the estimated open circuit voltage cancel each other out and the advantages of the respective remaining capacities can be fully utilized. The uniform calculation accuracy can be ensured and the final remaining capacity can always be obtained with accuracy.

16 Claims, 8 Drawing Sheets

| T\kΔl/Δt | 0 | 5 | 10 | 40 | 50 |
|---|---|---|---|---|---|
| -30 | *.**** | *.**** | *.**** | *.**** | *.**** |
| -20 | *.**** | *.**** | *.**** | *.**** | *.**** |
| -10 | *.**** | *.**** | *.**** | *.**** | *.**** |
| 0 | *.**** | *.**** | *.**** | *.**** | *.**** |
| 10 | *.**** | *.**** | *.**** | *.**** | *.**** |
| 25 | 0.0057 | 0.0057 | 0.0035 | 0.0032 | 0.0031 |
| 40 | *.**** | *.**** | *.**** | *.**** | *.**** |
| 50 | *.**** | *.**** | *.**** | *.**** | *.**** |

FIG.7

| T\SOCv (%) | 0 | 10 | 20 | 30 | 40 | 50 | 60 | 70 | 80 | 90 | 100 |
|---|---|---|---|---|---|---|---|---|---|---|---|
| -30 | . | . | . | . | . | . | . | . | . | . | . |
| -20 | . | . | . | . | . | . | . | . | . | . | . |
| -10 | . | . | . | . | . | . | . | . | . | . | . |
| 0 | . | . | . | . | . | . | . | . | . | . | . |
| 10 | . | . | . | . | . | . | . | . | . | . | . |
| 25 | . | . | . | . | . | 298.96 | 308.81 | 317.21 | 324.31 | . | . |
| 40 | . | . | . | . | . | . | . | . | . | . | . |
| 50 | . | . | . | . | . | . | . | . | . | . | . |

| $k\Delta I/\Delta t$ | 0 | 3 | 10 | 20 | 50 |
|---|---|---|---|---|---|
| w | 0.999 | 0.9995 | 0.9998 | 1 | 1 |

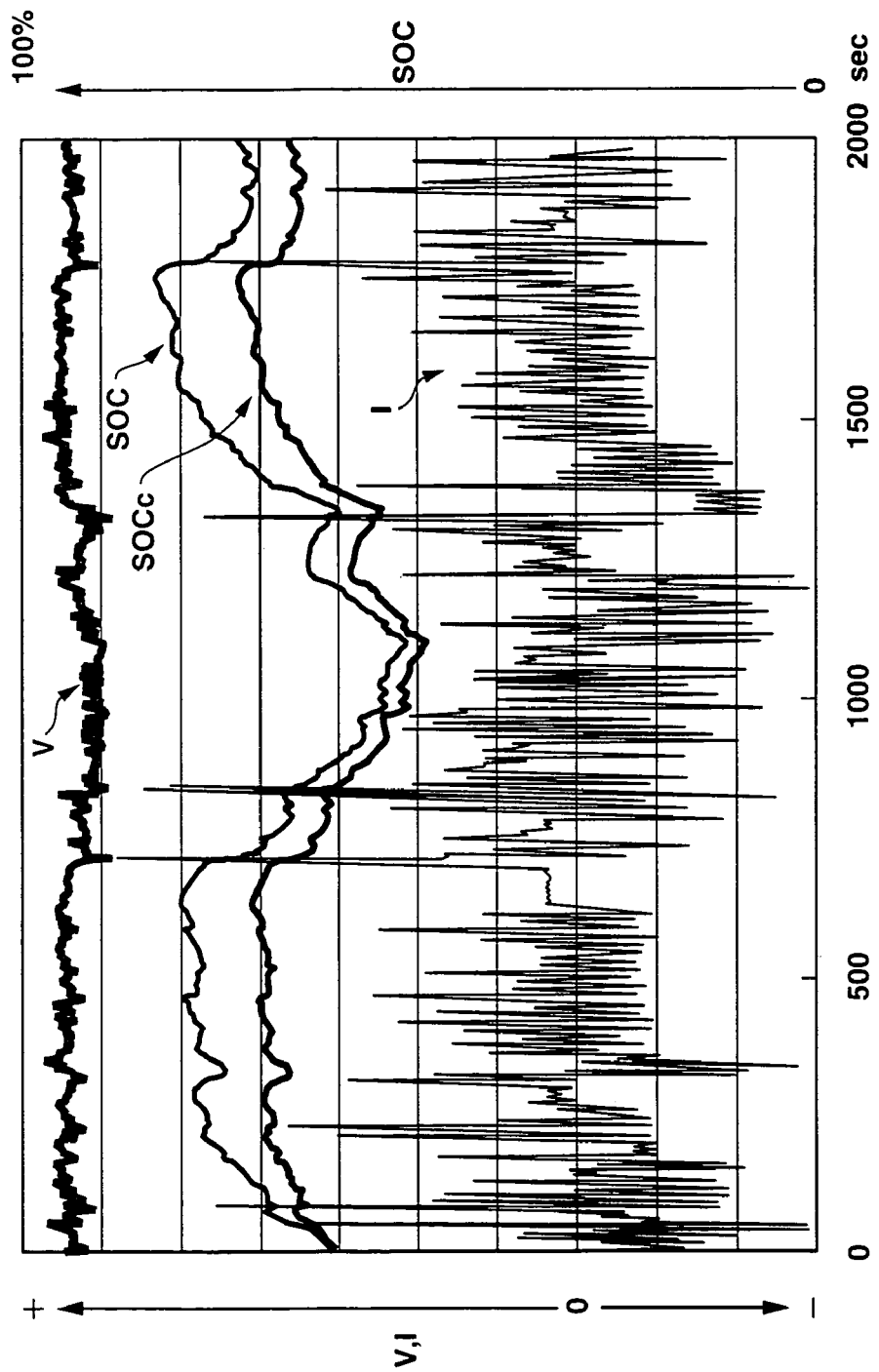

SYSTEM FOR CALCULATING REMAINING CAPACITY OF ENERGY STORAGE DEVICE

This application claims benefit of Japanese Application No. 2004-7376 filed on Jan. 14, 2004, the contents of which are incorporated by this reference.

BACKGROUND OF THE INVENTION

1. Field of the Invention

The present invention relates to a system for calculating the remaining capacity of an energy storage device such as a secondary battery or an electrochemical capacitor.

2. Description of the Related Art

The miniaturization of energy storage devices such as secondary batteries including nickel metal hydride batteries and lithium-ion batteries, and electrochemical capacitors including electric double layer capacitors is advancing, and the increase of the energy densities thereof is also encouraged. Those energy storage devices are actively used as power sources for portable information communication devices, electric vehicles, and hybrid electric vehicles.

To effectively utilize the energy storage device, grasping the accurate residual or remaining capacity (hereinafter referred to as remaining capacity) thereof is of importance. A first approach of integrating the charge and discharge current of an energy storage device to calculate the remaining capacity thereof and a second approach of obtaining the remaining capacity of the energy storage device based on its open circuit voltage are known. The first approach has an advantage in that the determination of remaining capacity is not influenced by the load fluctuation in the energy storage device caused by peak current, but has a disadvantage in that a cumulative error often occurs (particularly, the error may increase during high-load conditions). The second approach has an advantage in that the efficiency is high so long as the open circuit voltage is estimated with accuracy but has a disadvantage in that even when load significantly changes for a short time, the calculated remaining capacity easily varies. Accordingly, various techniques of calculating the remaining capacity utilizing the above two approaches are provided.

For example, Japanese Unexamined Patent Application Publication No. 6-242193 (Patent Document 1) discloses a technique for determining the remaining capacity of a battery on the basis of its open circuit voltage obtained from the battery voltage measured when an electric vehicle stops, detecting the discharged capacity based on the integrated value of the discharge current of the battery, and calculating the fully-charged capacity on the basis of the discharged capacity and the remaining capacity during the stop, thus obtaining the remaining capacity from the fully-charged capacity and the discharged capacity.

Japanese Unexamined Patent Application Publication No. 8-179018 (Patent Document 2) discloses a technique of calculating the remaining capacity of a battery such as a lithium-ion battery, in which the battery capacity and the battery voltage have linear proportional relationship, on the basis of current integration obtained after discharging or charging the battery for an arbitrary period, the voltage before discharging or charging, and the voltage after discharging or charging.

In addition, Japanese Unexamined Patent Application Publication No. 11-223665 (Patent Document 3) discloses a technique for compensating the calculation of the remaining capacity of a battery on the basis of the rate of change in the difference between the remaining capacity obtained by integrating the charge and discharge current of the battery and the remaining capacity estimated based on the open circuit voltage thereof.

According to the technique disclosed in Patent Document 1, however, the accuracy with which the remaining capacity of the battery is calculated while the electric vehicle is running is not ensured. The open circuit voltage is obtained based on the battery voltage measured when the vehicle stops. In electric vehicles, however, even when its motor stops, current flows through a load, e.g., an inverter. Accordingly, the accurate open circuit voltage is not always detected. Therefore, the technique of Patent Document 1 is of limited application. It is difficult to apply this technique to hybrid electric vehicles in which charging and discharging are repeated.

Similarly, according to the technique disclosed in Patent Document 2, the battery voltage before or after charging and discharging is regarded as the open circuit voltage. For the above-mentioned reason, the open circuit voltage is not always detected with accuracy. In addition, this technique tends to improve the accuracy upon discharging. Consideration is not given to the accuracy upon charging. It is difficult to apply this technique to hybrid electric vehicles in which charging and discharging are repeated.

Further, according to the technique disclosed in Patent Document 3, only when the difference between the remaining capacity based on current integration and the estimated remaining capacity based on the open circuit voltage is greater than a predetermined value is the calculated remaining capacity is updated. Accordingly, there is a high probability that the calculated remaining capacity sharply increases upon update. Therefore, when this technique is applied to a hybrid electric vehicle, an abrupt change in calculated remaining capacity may adversely affect vehicle control.

SUMMARY OF THE INVENTION

Accordingly, it is an object of the present invention to provide a system for calculating the remaining capacity of an energy storage device, which is capable of making full use of the advantages of the remaining capacity of the energy storage device obtained based on current integration and those of the remaining capacity thereof obtained based on its open circuit voltage and also capable of always obtaining the final remaining capacity with uniform accuracy.

In brief, according to the present invention, the system includes: voltage detection means for detecting the terminal voltage of an energy storage device; current detection means for detecting the charge and discharge current of the energy storage device; first calculation means for integrating the charge and discharge current detected by the current detection means to calculate a first remaining capacity; second calculation means for estimating the open circuit voltage of the energy storage device on the basis of the terminal voltage detected by the voltage detection means, the charge and discharge current detected by the current detection means, and the impedance of the equivalent circuit of the energy storage device to calculate a second remaining capacity based on the estimated open circuit voltage; and third calculation means for weighting the first and second remaining capacities with a weight determined depending on the operating conditions of the energy storage device and combining the weighted remaining capacities into the remaining capacity of the energy storage device.

Other features and advantages of the present invention will become more apparent from the following description.

BRIEF DESCRIPTION OF THE DRAWINGS

FIG. 7 is a table explaining the remaining capacity;

FIG. 8 is a table explaining weight;

FIG. 11 is a diagram explaining a result of calculation of the remaining capacity during actual driving.

DESCRIPTION OF THE PREFERRED EMBODIMENTS

Figure 1:
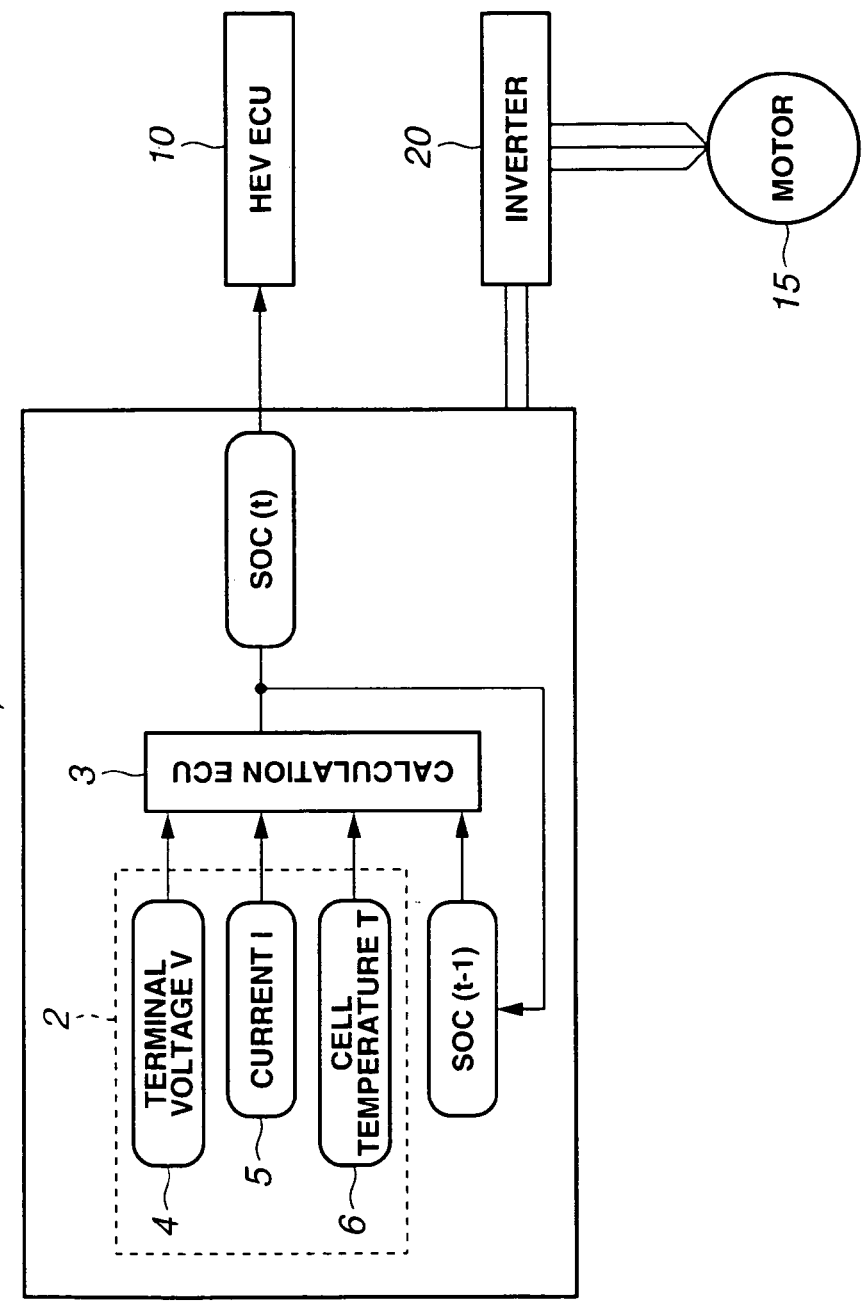
FIG. 1 is a block diagram showing the structure of a system according to an embodiment of the present invention, the system being applied to a hybrid electric vehicle.

FIG. 1 shows an embodiment of the present invention. According to the present embodiment, a system for calculating the remaining capacity of an energy storage device is applied to a hybrid electric vehicle (HEV) with the combination of an engine and a motor. Referring to FIG. 1, an HEV power supply unit 1 includes; a battery 2 which serves as an energy storage device and is composed of, for example, a plurality of multi-cell battery packs connected in series; and a calculation unit (electronic control unit (ECU) for calculation) 3 for performing energy management, i.e., calculating the remaining capacity of the battery 2, controlling cooling or charging the battery 2, detecting malfunction, and performing the protecting operation upon detecting malfunction. The battery 2 and the calculation unit 3 are packaged in one casing.

In the present embodiment the description will be based on the assumption that a lithium-ion secondary battery is used as an energy storage device. The remaining capacity calculating method according to the present invention can also be applied to electrochemical capacitors and other secondary batteries.

The calculation unit 3 includes a microcomputer and calculates the state of charge (SOC), i.e., the remaining capacity SOC(t) of the battery 2 every predetermined time t on the basis of the terminal voltage V of the battery 2 measured by a voltage sensor 4, the charge and discharge current I of the battery 2 measured by a current sensor 5, and temperature (cell temperature) T of the battery 2 measured by a temperature sensor 6.

The remaining capacity value SOC(t) is output from the calculation unit 3 of the power supply unit 1 to an electronic control unit (HEV ECU) 10 for HEV control through, for example, a controller area network (CAN) communication line. The remaining capacity SOC(t) is used as basic data for vehicle control, i.e., data to display the battery remaining capacity or warning. In addition, the remaining capacity value SOC(t) is also used as data (a base value in calculating the remaining capacity based on current integration which will be described below) for SOC(t−1) in the preceding operation period.

The HEV ECU 10 includes a microcomputer similar to the calculation unit 3 and performs control for the operation of the HEV and other necessary controls based on instructions of a driver. Specifically, the HEV ECU 10 detects the state of the vehicle on the basis of a signal from the power supply unit 1 and signals from sensors and switches (not shown) and controls components, e.g., an inverter 20, an engine (not shown), and an automatic transmission (not shown) through dedicated control units (not shown). Alternatively, the HEV ECU 10 directly controls the above components. The inverter 20 converts DC power supplied from the battery 2 into AC power to drive a motor 15.

Figure 2:
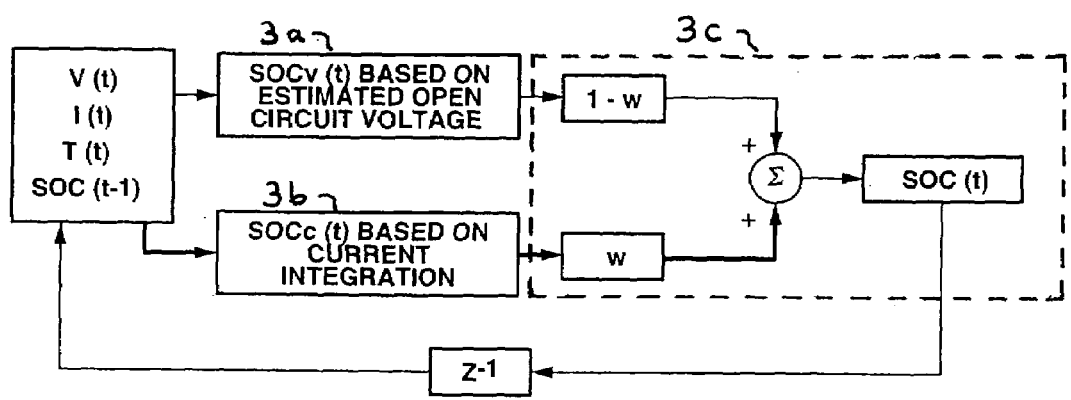
FIG. 2 is a block diagram of an algorithm for estimating the remaining capacity of a battery.

The calculation of the remaining capacity SOC by the calculation unit 3 is executed according to an estimation algorithm shown in FIG. 2. The SOC estimation algorithm uses measurable parameters in the battery 2, i.e., the terminal voltage V, the current I, and the temperature T. According to this algorithm, by functions serving as first to third calculation means, a remaining capacity SOCc as a first remaining capacity 3b is based on current integration and a remaining capacity SOCv as a second remaining capacity 3a is based on the estimated battery open circuit voltage Vo are simultaneously calculated, the calculated remaining capacities SOCc and SOCv are respectively weighted, and the weighted remaining capacities SOCc and SOCv are then combined into a third remaining capacity SOC 3c. The obtained remaining capacity SOC is generated as the remaining capacity of the battery 2.

The remaining capacity SOCc based on the integration of the current I and the remaining capacity SOCv based on the estimated open circuit voltage Vo have advantages and disadvantages, respectively. The remaining capacity SOCc based on the current integration is not influenced by the load fluctuation in the battery caused by peak current but a cumulative error often occurs. Particularly, the error may increase during high-load conditions. For the remaining capacity SOCv based on the estimated open circuit voltage Vo, the accurate value can be substantially obtained under normal conditions. When the load significantly changes for a short time, however, the value may fluctuate.

According to the present SOC estimation algorithm, therefore, a remaining capacity SOCc(t) based on the integration of the current I and a remaining capacity SOCv(t) obtained from the estimated battery open circuit voltage Vo are weighted with a weight (weighting factor) w, which varies depending on the operating conditions of the battery 2 as needed, and the weighted remaining capacities are then combined into the remaining capacity SOC(t). Thus, the disadvantages of the remaining capacities SOCc and SOCv cancel each other out and the advantages thereof can be fully utilized. The weight w varies within the range from 0 to 1. The combined remaining capacity SOC(t) is expressed by the following Expression (1).

$$SOC(t) = w \cdot SOCc(t) + (1-w) \cdot SOCv(t) \qquad (1)$$

It is necessary to determine the weight w using parameters capable of accurately representing the present operating conditions of the battery. For the parameters, the rate of change in current per unit time and the difference between the remaining capacities SOCc and SOCv can be used. The rate of change in current per unit time directly reflects the load fluctuation of the battery. However, the simple rate of change in current is influenced by a rapid change in current, i.e., a current spike.

According to the present embodiment, therefore, to prevent the influence by an instantaneous change in current, the rate of change in current subjected to processing related to the simple average, moving average, or weighted average of predetermined amount of sample data is used. Particularly, in consideration of current delay, the weight w is determined using the moving average which can properly reflect hysteresis on a change in the state of charge or discharge of the battery.

The weight w is determined based on the moving average of the current I. When the moving average of the current I is large, the weight for the remaining capacity based on the current integration is increased and that for the remaining capacity based on the estimated open circuit voltage is reduced. Thus, the influence by the load fluctuation can be accurately reflected by the remaining capacity based on the current integration and the fluctuation of the remaining capacity based on the estimated open circuit voltage can be prevented. On the contrary, when the moving average of the current I is small, the weight for the remaining capacity based on the current integration is reduced and that for the remaining capacity based on the estimated open circuit voltage is increased. Consequently, the influence of the cumulative error caused by current integration can be avoided. The accurate remaining capacity can be calculated by estimating the open circuit voltage.

In other words, the moving average of the current I functions as a low-pass filter for a high frequency component in current. Due to filtering using the moving average, a current spike caused by load fluctuation during driving can be eliminated without increasing delay. Thus, the state of the battery can be grasped with accuracy, the disadvantages of the remaining capacities SOCc and SOCv can cancel each other out, and the advantages thereof can be fully utilized. The accuracy of estimating the remaining capacity can be remarkably increased.

Further, as the features of the present SOC estimation algorithm, the internal conditions of the battery are electrochemically grasped based on a theory of battery operation, thus improving the accuracy of calculating the remaining capacity SOCv based on the open circuit voltage Vo of the battery. The calculation of the remaining capacities SOCc and SOCv according to the present estimation algorithm will now be described in detail.

First, the remaining capacity SOCc based on the current integration is obtained using the remaining capacity SOC, combined according to the weight w, as a base value by integrating the current I every predetermined time as shown in the following Expression (2):

$$SOCc(t)=SOC(t-1)-\int[100\eta I/Ah)+SD]dt/3600 \qquad (2)$$

where, η: current efficiency,
Ah: current capacity (variable depending on temperature), and
SD: self-discharge rate.

In Expression (2), the current efficiency η and the self-discharge rate SD can be regarded as constants (for example, η=1, SD=0). The current capacity Ah varies depending on temperature. Therefore, in calculating the remaining capacity SOCc based on the current integration, the current capacity Ah is calculated by measuring a variation in cell capacity depending on temperature as a function.

Specifically, the calculation of the remaining capacity SOCc(t) using Expression (2) is performed by discrete time processing through the calculation ECU 3. The remaining capacity SOCc(t-1) combined in the preceding operation period is input as a base value (delay operator Z-1 in FIG. 2) for current integration. Therefore, the error does not accumulate or diverge. Even when an initial value is remarkably different from the true value, the value converges on the true value after a predetermined lapse of time (e.g., several minutes).

Figure 3:
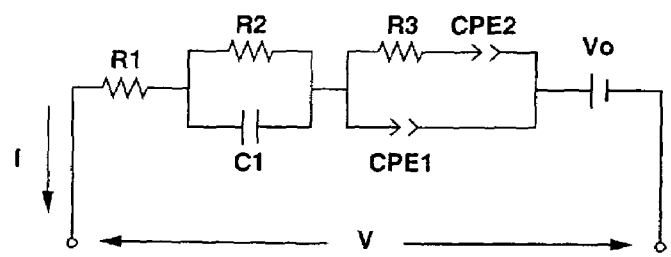
FIG. 3 is a circuit diagram showing an equivalent circuit model.

On the other hand, to calculate the remaining capacity SOCv based on the estimated open circuit voltage Vo, the internal impedance Z of the battery is first obtained using an equivalent circuit model shown in FIG. 3. Parameters, i.e., resistances R1 to R3 and capacitances C1, CPE1, and CPE2 (CPE1 and CPE2 represent double layer capacitances) are connected in series and parallel in the equivalent circuit model. The parameters are determined by curve fitting using the well-known Cole-Cole plot according to the alternating current impedance method.

The internal impedance Z obtained from those parameters greatly varies depending on the temperature, the electrochemical reaction rate, the frequency component of the charge and discharge current of the battery. Therefore, instead of the frequency component, the above-mentioned moving average of the current I per unit time is used as a parameter to determine the internal impedance Z. The impedance is measured based on the moving average of the current I and the temperature T and it is stored as data. After that, a table regarding the impedance Z (impedance table in FIG. 6 which will be described below) is constructed on the basis of the moving average of the current I per unit time and the temperature T. The impedance Z is obtained using the table. An estimation value of the open circuit voltage Vo is obtained using the following Expression (3) on the basis of the impedance Z and the measured terminal voltage V and current I.

$$V=Vo-I\cdot Z \qquad (3)$$

As mentioned above, the moving average of the current I is also used as the parameter to determine the weight w. The weight w and the impedance Z can be easily calculated using the moving average. Specifically, as temperature becomes lower, the internal impedance of the battery becomes higher, resulting in a decrease in the rate of change in current. As will be described below, the weight w and the impedance Z are determined using the compensated rate of change in current KΔI/Δt, obtained by temperature-compensating the moving average of the current I.

After the open circuit voltage Vo is estimated, the remaining capacity SOCv is calculated based on the electrochemical relationship in the battery. Specifically, the relationship between the open circuit voltage Vo and the remaining capacity SOCv is expressed using the well-known Nernst's equation describing the relationship between the electrode potential and the activity of ion in equilibrium. Thus, the following Expression (4) is obtained:

$$Vo=E+[(Rg\cdot T/Ne\cdot F)\times 1nSOCv/(100-SOCv)]+Y \qquad (4)$$

where, E: normal electrode potential (E=3.745 in the lithium-ion battery according to the present embodiment),
Rg: gas constant (8.314J/mol-K),
T: temperature (absolute temperature K),
Ne: ionic valence (Ne=1 in the lithium-ion battery according to the present embodiment), and
F: Faraday constant (96485C/mol).

In Expression (4), Y denotes a correction term and expresses the voltage-SOC characteristic at normal temperature as a function of SOC. When SOCv=X, Y can be expressed as a three-dimensional function of SOC as shown in the following Expression (5).

$$Y = -10^{-6}X^3 + 9 \cdot 10^{-5}X^2 + 0.013X - 0.7311 \quad (5)$$

The strong correlation among the remaining capacity SOCv, the open circuit voltage Vo, and the temperature T is found from Expression (4). In this instance, the remaining capacity SOCv can be calculated using the open circuit voltage Vo and the temperature T as parameters and Expression (4). Actually, it is necessary to consider the charge and discharge characteristics of a battery to be used and the operating conditions thereof.

To grasp the actual state of the battery from the relationship represented by Expression (4), therefore, the SOC-Vo characteristic at normal temperature is used as reference and a charging and discharging test or a simulation is performed in various temperature ranges, thus storing actual measurement data. A table (remaining capacity table in FIG. 7 which will be described below) regarding the remaining capacity SOCv obtained using the open circuit voltage Vo and the temperature T as parameters is constructed based on the stored actual measurement data. The remaining capacity SOCv is obtained from this table.

The calculation of the remaining capacities SOCc and SOCv according to the above-mentioned SOC estimation algorithm and the combination thereof will now be described with reference to FIG. 4.

Figure 4:
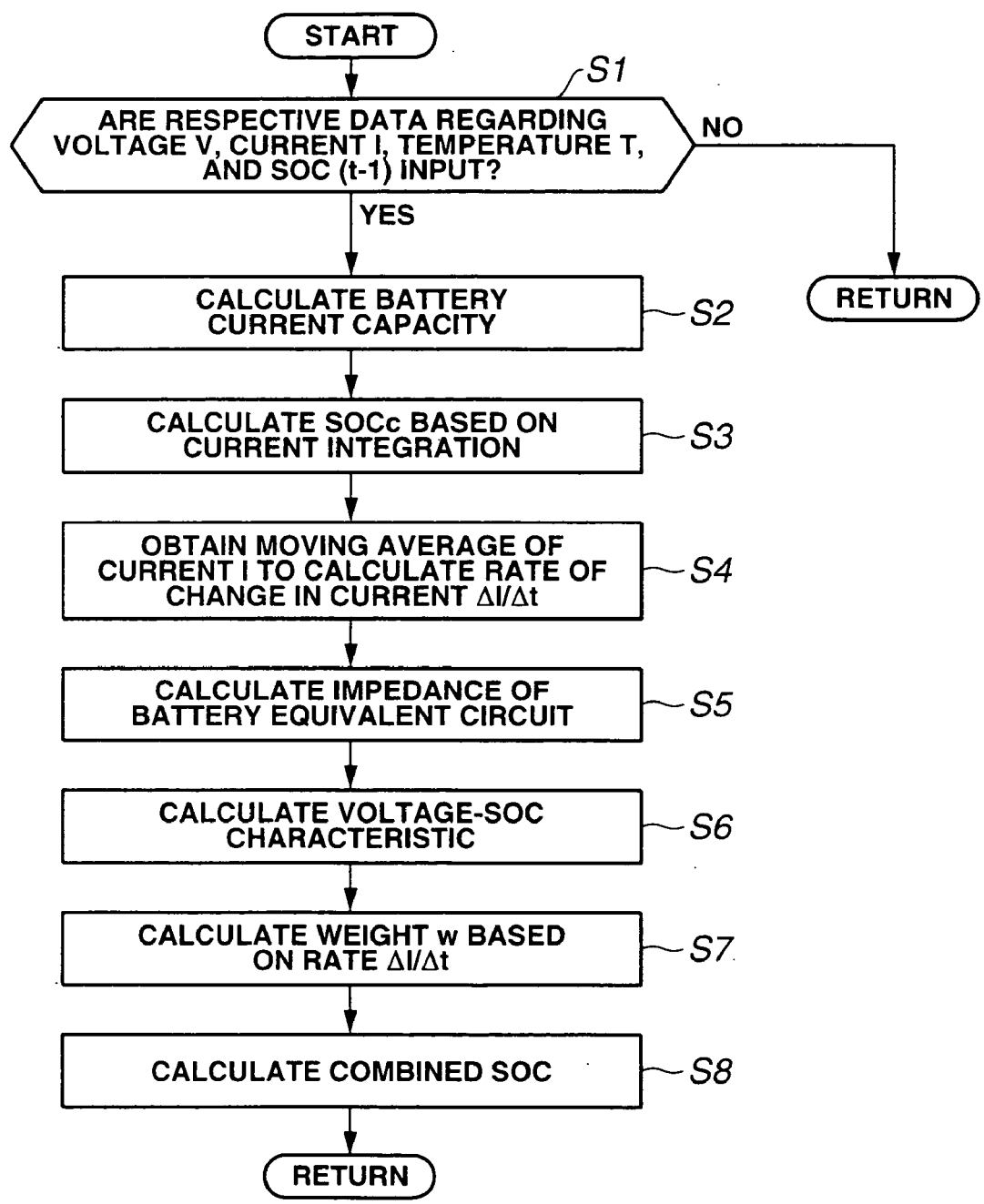
FIG. 4 is a flowchart of a process of estimating the battery remaining capacity.

FIG. 4 shows a flowchart of a fundamental process of estimating the remaining capacity of the battery. This process is executed by the calculation ECU 3 of the power supply unit 1. In FIG. 4, for convenience of explanation, the remaining capacity SOCc based on the current integration is calculated and, after that, the remaining capacity SOCv based on the estimated open circuit voltage Vo is calculated. Actually, the remaining capacities SOCc and SOCv are simultaneously calculated.

The battery remaining capacity estimation process of FIG. 4 is executed every predetermined time (e.g., every 0.1 seconds). In step S1, it is determined whether respective data regarding the terminal voltage V, the current I, the temperature T, and the remaining capacity SOC(t−1), combined in the preceding operation period of the battery 2 have been input. It is assumed that the terminal voltage V is the average of voltages of the battery packs, the current I is the sum of currents of the battery packs, and the data regarding the terminal voltage V and the current I are obtained every, for example, 0.1 seconds. In addition, it is assumed that the temperature T is measured every 10 seconds.

Figures 5, 6:
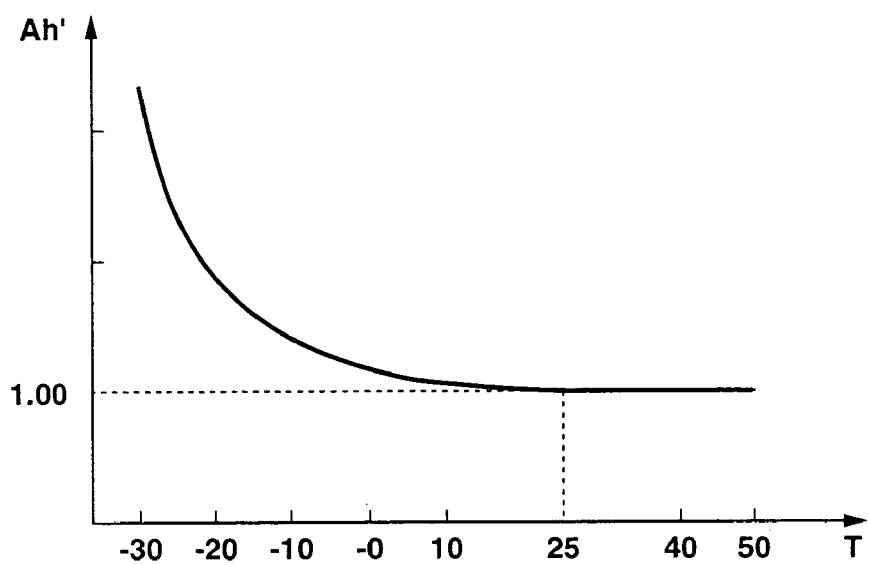
FIG. 5 is an explanatory diagram showing a table of the current capacity.
FIG. 6 is a table explaining the impedance.

If no data is newly input in step S1, the process is exited. If new data is input in step S1, the process proceeds to step S2. In step S2, the current capacity of the battery is calculated with reference to FIG. 5 which shows a table of the current capacity. FIG. 5 uses the temperature T as a parameter and shows the ratio Ah' of the current capacity to the rated capacity (e.g., rated current capacity on condition that the predetermined number of cells in one battery pack is set to a reference unit) as a predetermined reference. For the capacity ratio Ah' (=1.00) at a normal temperature (25° C.), as temperature becomes lower, the current capacity also becomes lower, so that the capacity ratio Ah' becomes larger. The current capacity Ah at every temperature T to be measured is calculated using the capacity ratio Ah' obtained by reference to FIG. 5.

Subsequently, the process proceeds to step S3. The remaining capacity SOCc(t) based on the current integration is calculated using the current capacity Ah obtained from FIG. 5, an input value of the current I, the remaining capacity SOC(t−1) combined in the preceding operation period, and Expression (2). Further, in step S4, the moving average of the current I is calculated to obtain the rate of change in current per unit time ΔI/Δt. For example, when the current I is sampled every 0.1 seconds and the operation period of current integration is 0.5 seconds, the moving average of five data is obtained.

In step S5, the impedance Z of the battery equivalent circuit is calculated with reference to the impedance table of FIG. 6. The open circuit voltage Vo of the battery 2 is estimated based on the obtained impedance Z. The impedance table uses the compensated rate of change in current KΔI/Δt, obtained by temperature-compensating the rate of change in current ΔI/Δt (moving average of the current I per unit time), and the temperature T as parameters and represents the impedance Z of the equivalent circuit. Specifically, at the same compensated rate of change in current KΔI/Δt, as the temperature T becomes lower, the impedance Z becomes higher. At the same temperature, as the compensated rate of change in current KΔI/Δt becomes smaller, the impedance Z becomes higher.

Subsequently, the process proceeds to step S6. The voltage-SOC characteristic is calculated to obtain the remaining capacity SOCv. In other words, the remaining capacity SOCv is calculated using the temperature T and the estimated open circuit voltage Vo as parameters by reference to the remaining capacity table of FIG. 7. The remaining capacity table is constructed by grasping the electrochemical state of the battery according to Nernst's equation. In brief, as the temperature T and the open circuit voltage Vo become lower, the remaining capacity SOCv becomes smaller. As the temperature T and the open circuit voltage Vo become higher, the remaining capacity SCOv becomes larger.

FIGS. 6 and 7 each represent a set of data obtained in normal conditions. Data obtained in other conditions is not shown.

Subsequently, the process proceeds to step S7. The weight w is calculated by reference to a weight table of FIG. 8. The weight table is a one-dimensional table using the compensated rate of change in current KΔI/Δt as a parameter. Specifically, as the compensated rate of change in current KΔI/Δt becomes smaller, i.e., as the battery load fluctuation is smaller, the weight w is set lower, thus reducing the weight for the remaining capacity SOCc based on the current integration. In step S8, according to the foregoing Expression (1), the remaining capacity SOCc based on the current integration and the remaining capacity SOCv based on the estimated open circuit voltage Vo are weighted with the weight w and are then combined into the final remaining capacity SOC(t). The present calculation process of one cycle terminates.

Figure 9:
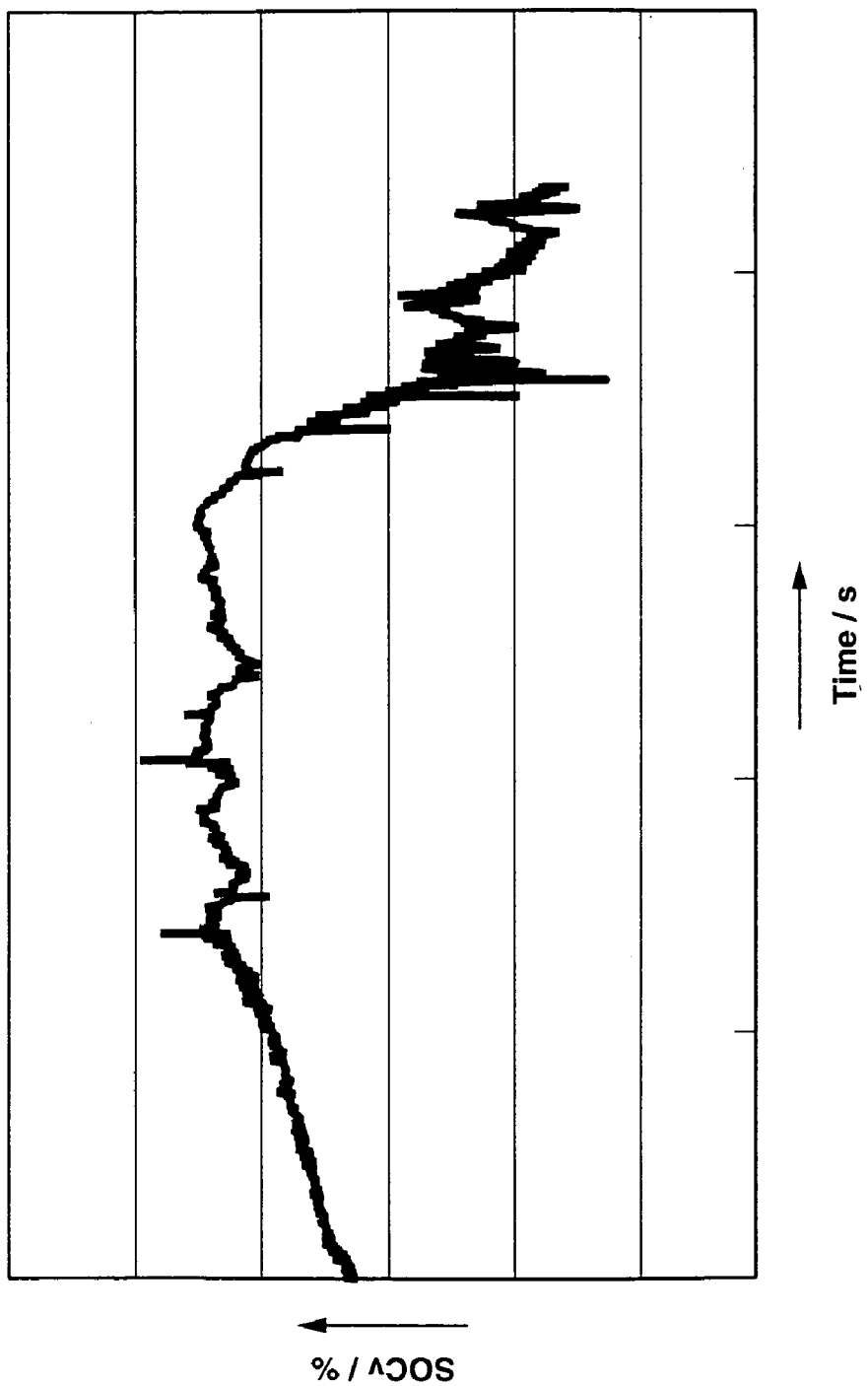
FIG. 9 is a diagram explaining the remaining capacity when the moving average of current is not obtained.
Figure 10:
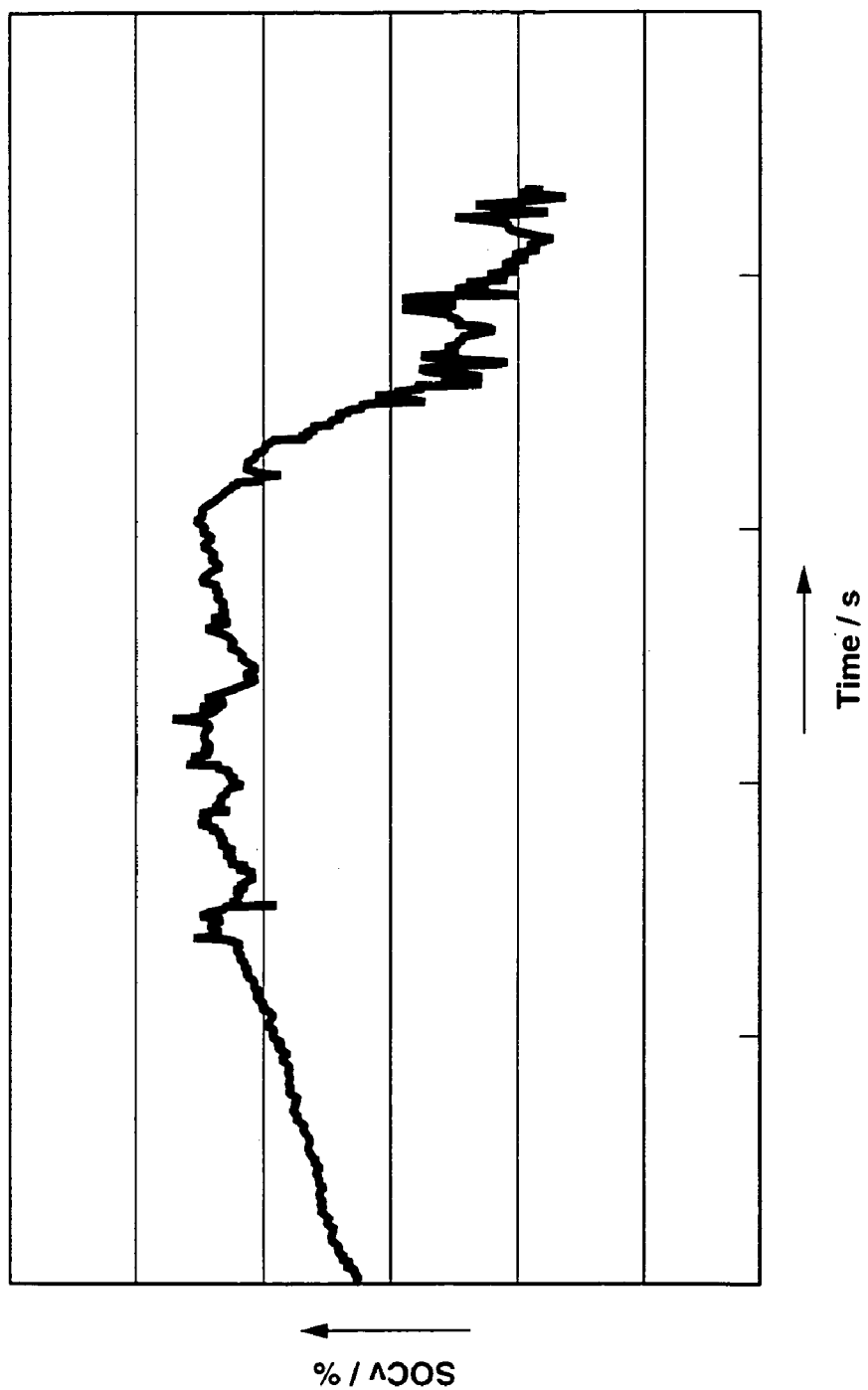
FIG. 10 is a diagram explaining the remaining capacity when the moving average of current is obtained.

In this instance, the remaining capacity calculation in the case where the moving average process is performed is compared to that in the case where the moving average process is not performed. When the moving average of current is not obtained and the remaining capacity SOCv is calculated, as shown in FIG. 9, abrupt variations in the remaining capacity SOCv are locally caused by current spikes. Disadvantageously, the accuracy of the combined remaining capacity SOC is decreased. On the contrary, when the moving average of current is obtained and the remaining capacity SOCv is calculated, as shown in FIG. 10, the influence of the current spikes is eliminated from the remaining capacity SOCv, so that the remaining capacity can be grasped with accuracy on condition that the load fluctuation is relatively small.

FIG. 11 shows the calculated remaining capacity during actual driving, i.e., a change in the remaining capacity SOCc based on the current integration and a change in the combined remaining capacity SOC on condition that a driving course is relatively full of ups and downs and cell temperature is substantially 45° C. Referring to FIG. 11, before an elapsed time of 1500 seconds during which charging and discharging the battery is repeated, the calculated remaining capacity SOCc based on the current integration is favorably reflected in the combined remaining capacity SOC. After the elapsed time of 1500 seconds during which the rate of charging the battery tends to increase, an increase in the remaining capacity SOCc based on the current integration slows down and error tends to become larger. The weight for the remaining capacity SOCv (not shown) based on the estimated open circuit voltage is increased and, therefore, the weighted remaining capacity SOCv is reflected in the combined remaining capacity SOC. Consequently, the combined remaining capacity SOC increases with the increased charging rate. A change in remaining capacity can be grasped with accuracy.

As mentioned above, when the final remaining capacity is calculated using the remaining capacity SOCc based on the current integration and the remaining capacity SOCv based on the estimated open circuit voltage, the respective remaining capacities are optimally weighted using the weight w set depending on the operating conditions of the battery. Advantageously, there is no sharp change in the calculated remaining capacity by compensation at a certain time. A uniform calculation accuracy can be ensured and the remaining capacity of a battery (energy storage device) can always be obtained.

In the present invention, it will be apparent that a wide range of different embodiments can be formed based on this invention without departing from the spirit and scope of the invention. This invention will be restricted to the appended claims but not be limited to any specific embodiment.

What is claimed is:

1. A system for calculating the remaining capacity of an energy storage device, the system comprising:
   voltage detection means for detecting the terminal voltage of the energy storage device;
   current detection means for detecting the charge and discharge current of the energy storage device;
   first calculation means for integrating the charge and discharge current detected by the current detection means to calculate a first remaining capacity;
   second calculation means for estimating the open circuit voltage of the energy storage device on the basis of the terminal voltage detected by the voltage detection means, the charge and discharge current detected by the current detection means and the impedance of the equivalent circuit of the energy storage device calculated in correspondence with the moving average of the current and for calculating a second remaining capacity based on the estimated open circuit voltage; and
   third calculation means for weighting the first and second remaining capacities with a weight that is set based on the moving average of the current and combining the weighted remaining capacities into the remaining capacity of the energy storage device.

2. The system according to claim 1, wherein the third calculation means determines the weight on the basis of the moving average of the charge and discharge current detected by the current detection means.

3. The system according to claim 1, wherein the second calculation means obtains the second remaining capacity on the basis of the open circuit voltage of the energy storage device and the temperature thereof in accordance with the electrochemical relationship there between in the energy storage device.

4. The system according to claim 2, wherein the second calculation means obtains the second remaining capacity on the basis of the open circuit voltage of the energy storage device and the temperature thereof in accordance with the electrochemical relationship there between in the energy storage device.

5. The system according to claim 1, wherein the second calculation means calculates the impedance on the basis of the moving average of the charge and discharge current detected by the current detection means and the temperature of the energy storage device.

6. The system according to claim 2, wherein the second calculation means calculates the impedance on the basis of the moving average of the charge and discharge current detected by the current detection means and the temperature of the energy storage device.

7. The system according to claim 3, wherein the second calculation means calculates the impedance on the basis of the moving average of the charge and discharge current detected by the current detection means and the temperature of the energy storage device.

8. The system according to claim 4, wherein the second calculation means calculates the impedance on the basis of the moving average of the charge and discharge current detected by the current detection means and the temperature of the energy storage device.

9. The system according to claim 1, wherein the first calculation means integrates the charge and discharge current using the remaining capacity, combined by the third calculation means, as a base value to obtain the first remaining capacity.

10. The system according to claim 2, wherein the first calculation means integrates the charge and discharge current using the remaining capacity, combined by the third calculation means, as a base value to obtain the first remaining capacity.

11. The system according to claim 3, wherein the first calculation means integrates the charge and discharge current using the remaining capacity, combined by the third calculation means, as a base value to obtain the first remaining capacity.

12. The system according to claim 4, wherein the first calculation means integrates the charge and discharge current using the remaining capacity, combined by the third calculation means, as a base value to obtain the first remaining capacity.

13. The system according to claim 5, wherein the first calculation means integrates the charge and discharge current using the remaining capacity, combined by the third calculation means, as a base value to obtain the first remaining capacity.

14. The system according to claim 6, wherein the first calculation means integrates the charge and discharge current using the remaining capacity, combined by the third calculation means, as a base value to obtain the first remaining capacity.

15. The system according to claim 7, wherein the first calculation means integrates the charge and discharge current using the remaining capacity, combined by the third calculation means, as a base value to obtain the first remaining capacity.

16. The system according to claim 8, wherein the first calculation means integrates the charge and discharge current using the remaining capacity, combined by the third calculation means, as a base value to obtain the first remaining capacity.

* * * * *